United States Patent [19]

Johnson

[11] Patent Number: 4,873,705

[45] Date of Patent: Oct. 10, 1989

[54] METHOD OF AND SYSTEM FOR HIGH-SPEED, HIGH-ACCURACY FUNCTIONAL TESTING OF MEMORIES IN MICROPROCESSOR-BASED UNITS

[75] Inventor: Craig V. Johnson, Everett, Wash.

[73] Assignee: John Fluke Mfg. Co., Inc., Everett, Wash.

[21] Appl. No.: 148,901

[22] Filed: Jan. 27, 1988

[51] Int. Cl.4 ............................................. G06F 11/00
[52] U.S. Cl. ....................................... 371/21.2; 371/27
[58] Field of Search ........................ 371/21, 70, 24, 25, 371/27, 15, 23, 16; 365/201

[56] References Cited

U.S. PATENT DOCUMENTS

| | | | |
|---|---|---|---|
| 4,061,908 | 12/1977 | de Jonge | 365/201 X |
| 4,485,435 | 11/1984 | Sibley | 371/21 X |
| 4,569,048 | 2/1986 | Sargent | 371/16 |
| 4,631,724 | 12/1986 | Shimizu | 371/21 |
| 4,707,834 | 11/1987 | Frisch | 371/16 X |
| 4,715,034 | 12/1987 | Jacobson | 371/21 |
| 4,757,503 | 7/1988 | Hayes | 371/21 |
| 4,782,487 | 11/1988 | Smelser | 371/21 |

Primary Examiner—Jerry Smith
Assistant Examiner—Robert W. Beausoliel
Attorney, Agent, or Firm—George T. Noe; Stephen A. Becker

[57] ABSTRACT

A method of and system of high-speed, high-accuracy functional testing of memories in microprocessor-based units or boards under test includes a test system that is effectively permanently coupled to the unit under test bus structure during test execution and operates at the unit under test's clock rate. The test program may be stored in the unit under test's own memory, or may be electrically transferred from the test system's memory to the memory under test using a memory overlay technique.

Memory testing speed may be further increased by taking advantage of block move and compare features of newer microprocessors. An algorithm which exploits the block move and compare features is provided.

24 Claims, 1 Drawing Sheet

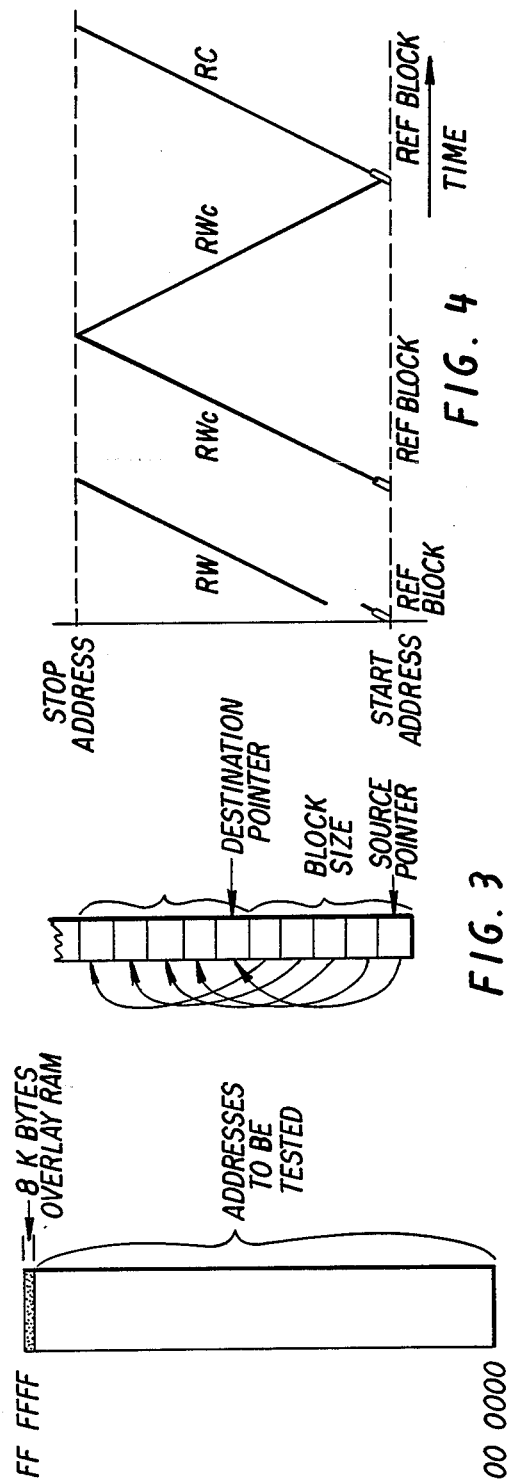

METHOD OF AND SYSTEM FOR HIGH-SPEED, HIGH-ACCURACY FUNCTIONAL TESTING OF MEMORIES IN MICROPROCESSOR-BASED UNITS

TECHNICAL FIELD OF THE INVENTION

The present invention relates generally to functional testing of memories, and in particular to a method of and system for functional testing of memories in microprocessor-based units at enhanced speeds while maintaining a high degree of accuracy.

BACKGROUND OF THE INVENTION

Functional testing of microprocessor-based units or boards is employed to locate faults or malfunctions which affect operation of semiconductor memories or chips. It has been recognized by those skilled in the art that a functional test will locate all the possible faults that may occur performs on the order of $2^N$ accesses, where N is the number of addressable locations or cells within the memory, and therefore is impractical because of the complexity and time involved. Accordingly, as a practical matter, any feasible test procedure must be concerned only with those faults that are most likely to occur, such as, for example, stuck data cells, defective decoders, defective address or data registers, and faults between address and data lines.

One test capable of detecting the most common faults by performing a number of operations at each memory address is the so-called march test that sequences or marches up and down through a range of addresses between given lower and upper bounds, performing the same operations, e.g., write and read, at each address. Early prior art investigators proposed rather lengthy and rigid march test, such a up to 30N tests, either writing the same bit into all cells, or writing a fixed pattern of "ones" and "zeros." While such tests located faults with a high degree of accuracy, they were very time consuming. In U.S. Pat. No. 4,715,034, David M. Jacobson taught a fast memory test algorithm which required only 5N operations using pseudorandom data to detect most of the common faults, and exploited the fact that the probability of failing to detect a fault was extremely small.

Where memory circuits are random-access memories (RAMs) of microprocessor-based systems, microprocessor emulation devices have been used for many years for performing functional tests in the process of design, production, or service testing and repair. An example of such a system is described in U.S. Pat. No. 4,455,654 to K. S. Bhaskar et al. The performance of memory testing in such microprocessor-based systems, or units under test (UUT's) is typically limited by accuracy-versus-speed tradeoffs which are dependent upon the emulator architecture and the test algorithm used. The microprocessor emulation device, which contains a microprocessor of the same type as that of the UUT, connects directly or via an interface pod to the UUT's bus structure, for example, by connecting directly into the UUT's microprocessor socket. All testing performed by such emulation devices has heretofore been carried out in a bus-access mode wherein the emulation device makes single cycles of bus accesses and acts on each one before making another. That is, the emulation device knows which addresses to write and read, and for one bus cycle makes a connection to the UUT's bus with a specific address preloaded on it so that the UUT's memory either will be written at that address, or will give the value of the data stored at that address, depending on whether a write or a read command is given. Then the emulation device switches over to its internal circuitry to generate another write command with a new address, or deal with information read from the UUT's memory. With the aforementioned Jacobson algorithm, a new pseudorandom number is calculated for each address. Since the use of single cycles of bus accesses has been the basis for prior art RAM testing, whether resident in a mainframe or a pod, increases in memory size translate directly into more cycles of bus accesses and a corresponding increase in testing time. Thus, even with faster test algorithms such as Jacobson's 5N probabilistic functional RAM test procedure, the trend toward providing increased RAM space presents a problem in terms of the time it takes to test a UUT.

SUMMARY OF THE INVENTION

In accordance with the present invention, a method of and system for high-speed, high-accuracy functional testing of memories in microprocessor-based UUTs provides a new solution to the memory test speed-versus-accuracy problem which results in one to two orders of magnitude in speed increase while suffering very little, if any, decrease in accuracy.

A test system including a microprocessor of the same type as that of the UUT is effectively permanently coupled to the bus structure of the UUT, and serves as a substitute microprocessor in executing a test program at a rate provided by the UUT's own clock to locate faults in the UUT memory. The test program may be stored in the UUT's own memory, or, preferably, within the test system's memory and applied to the UUT using a memory overlay technique. The test program is stored or overlaid in a portion of UUT memory not being tested for faults. By remaining effectively permanently coupled to the UUT's bus structure and executing a test program at the UUT's clock rate, an order of magnitude test speed increase over prior-art emulator-type memory testing may be realized.

Another feature of the present invention that results in an increase in memory testing speed is the use of block- or string-oriented instructions associated with some of the newer microprocessors. By taking advantage of block move and compare features, data from a range of memory addresses may be accessed, moved, and compared, rather than one-at-a-time single address accessing provided by prior art systems.

An algorithm which exploits such block move and compare features is a 5N probabilistic RAM test algorithm comprising four sweeps or passes of RAM addresses in which three write operations and two read operations are performed. First, a pseudorandom sequence of bits is written into a predetermined range of consecutively-addressed memory cells at the low-address end of the RAM to provide a reference block. The reference block is then iteratively replicated by sequentially writing the same pseudorandom sequence of bits into all of the remaining cells of the RAM, starting with the first address beyond the reference block and continuing to the highest address. For the second pass through the memory, the pseudorandom sequence of bits is complemented, and the replication steps are repeated to complement the data in each cell. For the third pass, a downward sweep from the highest address to the lowest address is performed. At each location, data is read and compared with its expected value, complemented, and written back. In a fourth and final pass through the memory, an upward sweep from the low-address end of the RAM to the high-address end is performed as data from each location is read and compared with the original pseudorandom sequence of bits.

An 8N probabilistic RAM test algorithm in accordance with the present invention comprises four sweeps of RAM addresses in which three write and five read operations are performed. Here, a reference block of pseudorandom bits is read by a first pointer and written into a next succeeding block by a second pointer. The pointers are moved together in spaced-apart relationship up through the memory in the first pass until all the cells are written. In the second pass, the pseudorandom bits in the reference block are complemented, and the read and write operations using pointers are repeated. The third and fourth passes are substantially the same as for the 5N test, except that the fourth pass involves two reads of each cell to compare bits indicated by the two pointers.

It is therefore one object of the present invention to provide a method of and system for functional testing of memories in microprocessor-based units in which testing speed is increased by at least one or two orders of magnitude while maintaining high accuracy in identifying and reporting faults.

It is another part of the present invention to provide a functional test algorithm which exploits block move and compare features of newer microprocessors.

It is a further object of the present invention to provide a test system which is effectively permanently coupled to the bus structure of a unit whose memory is being tested, and which executes memory test instructions at the unit's clock rate.

Other objects, features, and advantages of the present invention will become obvious to those having ordinary skill in the art upon a reading of the followed detailed description when taken in conjunction with the accompanying drawings.

BRIEF DESCRIPTION OF THE DRAWINGS

FIG. 2 depicts a memory map for use in overlaying a memory under test;

FIG. 3 shows an example of memory block movement wherein data can be moved from one range of memory addresses to another; and FIG. 4 is a graph showing a RAM test algorithm in accordance with the present invention.

DETAILED DESCRIPTION OF THE INVENTION

Figure 1:
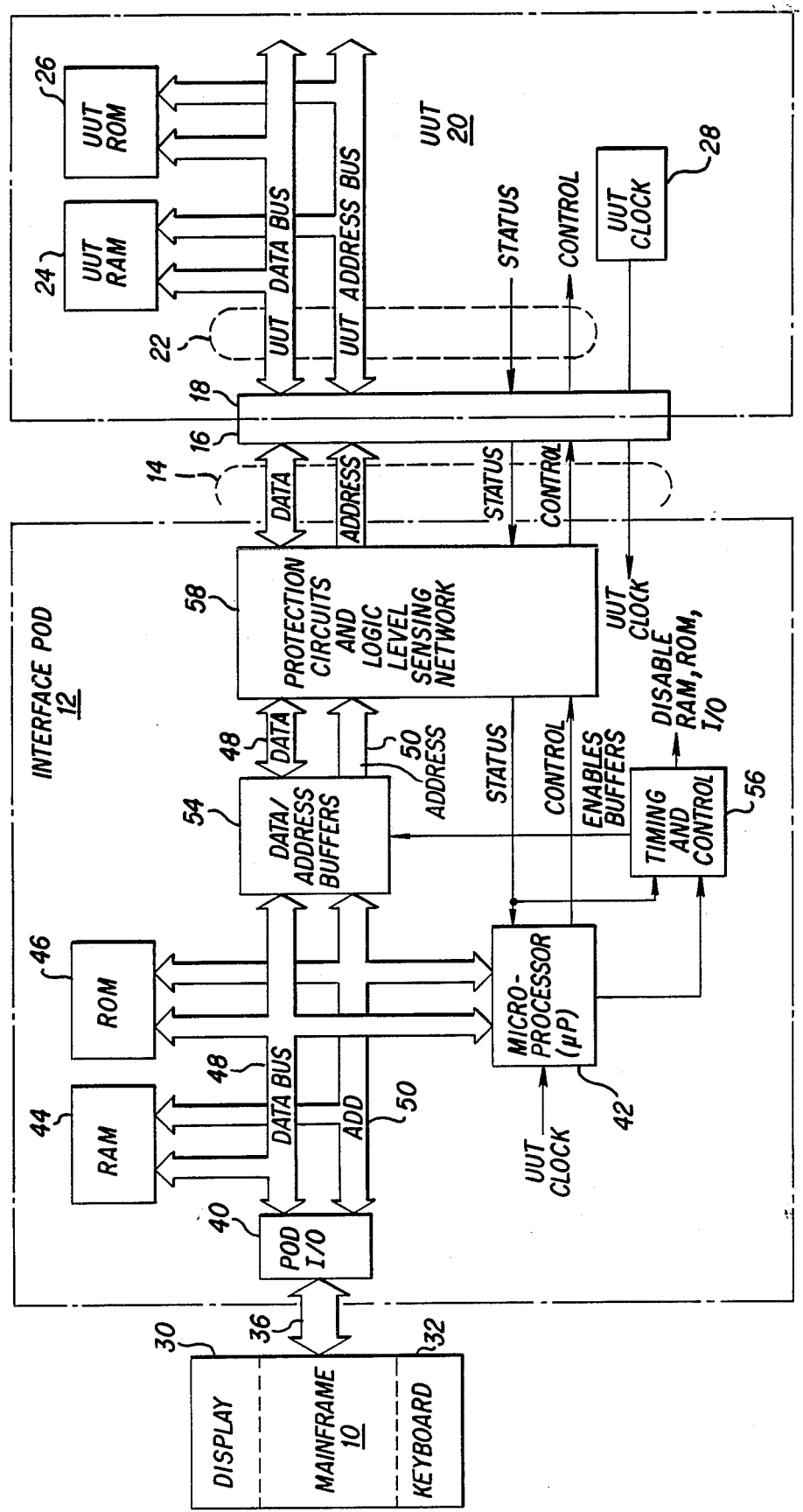
FIG. 1 is a generalized block diagram of a test system in accordance with the present invention.

Referring to FIG. 1, a generalized block diagram of a test system for functional testing of memory devices in microprocessor-based units in accordance with the present invention includes a mainframe unit 10 electrically connected to an interface pod 12. Interface pod 12 is connected via a cable 14 to a microprocessor connector 16 at a remote end thereof. Connector 16 mates with and is plugged into a microprocessor socket 18 of a unit under test (UUT) 20. Of course, if the microprocessor is soldered in, connector 16 would represent a clip-over adapter.

Since the memory devices to be tested are located within the UUT, the relevant portions of UUT 20 will be discussed first. The microprocessor which normally resides in socket 18 has been removed and replaced with connector 16 so that as far as UUT 20 is concerned, interface pod 12 appears to be its microprocessor. Connected to socket 18 is a UUT bus structure 22, which as is understood by those skilled in the art typically includes a plurality of address and data lines, as well as status and control lines. Coupled to UUT bus structure 22 are a random-access memory (RAM) 24 and a read-only memory (ROM) 26. While RAM 24 and ROM 26 are depicted as separate units, in actual practice they may be located physically within the same chip or package. UUT 20 also includes a UUT clock circuit 28, which produces clock pulses of a desired frequency for execution of the UUT's microprocessor and associated circuits. The UUT 20 herein depicted is incomplete and therefore may represent the central or core section of any of a wide variety of microprocessor-based systems having a memory device that can be advantageously tested in accordance with the present invention.

Mainframe unit 10 includes, among other things, a display 30 and a keyboard 32, and is capable of providing instructions to the interface pod 12 to initiate a memory test, and reporting the results of such tests to a user. Examples of commercially-available equipment representative of mainframe unit 10 are the 9000 Series Micro-System Troubleshooters and 9100 Digital Test System manufactured by John Fluke Mfg. Co., Inc.

Interface pod 12 is electrically connected to the mainframe unit 10 via a cable 36 and an input-output (I/O) interface 40. The interface pod 12 is specifically configured for testing a UUT that employs a particular type of microprocessor, for example, an Intel 80286, and accordingly transmits to the UUT bus structure 22 and receives therefrom information compatible with the particular microprocessor's machine language, signal timing, and logic levels. That is, interface pods are interchangeable, and a user simply chooses one that is designed to interface with the particular type of microprocessor employed in the UUT. For this example, let us assume that the UUT's microprocessor is the aforementioned 80286, and accordingly the interface pod 12 includes a complete 80286 kernel including microprocessor (uP) 42, RAM 44, ROM 46, and the earlier-mentioned I/O interface 40 interconnected by data and address buses 48 and 50, respectively. Connected to the data and address buses 48 and 50 are data and address buffers 54. The data buffers are bidirectional and are enabled by a control signal from a timing and control circuit 56. The address buffers are output-only buffers. Interposed between the data/address buffer 54 and the microprocessor connector 16 is a protection circuit and logic-level sensing network 58 that protects the interface pod 12 circuitry from over-voltage conditions and contains source and sense resistors to detect output drivability faults. For this particular interface pod, the microprocessor inputs from the UUT are referred to as status lines, and outputs to the UUT are referred to as control lines.

The mainframe unit 10 and interface pod 12 as herein established are largely conventional; however, the structure is set forth to provide a complete understanding of the novel memory testing mode of operation to be described. In normal mode of operation, typically called the troubleshooting mode, the mainframe/pod operation is substantially as described in U.S. Pat. No. 4,455,654.

The operating mode of interest is a second, or ancillary mode referred to as "RUN UUT" wherein the interface pod microprocessor 42 is effectively permanently connected through its buffers to the UUT's bus structure 22 to serve as a substitute microprocessor in executing the UUT's own internal programs such as those contained in ROM 26. In this mode of operation, the interface pod 12 adopts such microprocessor functions as those associated with the status/control lines, interrupt handling, timing, and memory and I/O addressing. Also, and perhaps most significant, microprocessor 42 executes the programs at the rate provided by UUT clock 28.

In order to effect functional testing of the UUT memory, i.e., RAM 24, memory test instructions or programs may be stored in and executed from the UUT's executable memory, or, preferably, such memory test instructions or programs may be stored in and executed from "overlaid" memory located in the interface pod 12.

Memory overlay is a technique that allows a test system to electrically substitute its own instructions for the instructions that its microprocessor attempts to read from the program memory of the unit being tested. Memory overlay can be mapped to any UUT memory space the same size as the space in the test system memory occupied by the overlaying memory.

In one preferred embodiment of the present invention employing an 80286 microprocessor system, overlay RAM of eight kilobytes of contiguous RAM is provided utilizing a portion of RAM 44. Overlay RAM is mapped to an eight kilobyte area normally occupied by power-up reset and boot instructions at the top of the UUT ROM. Refer to FIG. 2.

FIG. 2 represents a memory map of a 16 megabyte memory with hexadecimal address 00 0000 at the bottom and FF FFFF at the top, and this may suitably be the UUT memory comprising RAM 24 and ROM 26. Whenever the overlay RAM is mapped to begin at a particular address, such as in this case near the top of the UUT memory, and is enabled, a read operation within the overlay RAM address range returns data stored in the overlay RAM rather than data from the UUT memory. In this manner, any program code previously stored in the overlaid UUT memory is not "seen" by the processor and will still be there after the overlay RAM is disabled.

The memory test instructions or programs are loaded into the eight kilobyte overlay RAM, which in RUN UUT mode is enabled and electrically replaces the eight kilobyte space at the top of the UUT memory, allowing the remaining address, that is, almost all of UUT memory addresses, to be tested. Test results are accumulated in designated locations in interface pod 12 RAM 44 as the test program runs. Upon completion of the test program, the RUN UUT mode is terminated, and the test results are returned to the mainframe unit 10. Thus it can be seen that in the RUN UUT mode, interface pod 12 remains effectively permanently coupled to the UUT's bus structure and the memory test programs stored in overlay RAM are executed at the UUT clock rate as provided by clock 28, resulting in an order of magnitude speed increase over prior art emulator-type memory testing.

In memory test systems not having overlay memory capability the speed advantage of the present invention can still be attained by first positioning and testing a large enough portion of the UUT RAM to contain the memory test program by using the prior art bus access technique, then loading the memory test program into the tested portion of the UUT RAM to test the remainder of the UUT RAM using the present invention. Overlay memory, however, offers somewhat higher confidence in test results since the electrical integrity of interface pod 12 is typically regarded as better than that of a suspect UUT memory device.

Another feature of the present invention that results in an increase in memory testing speed is the use of block-or string-oriented instructions specific to the emulated processor to perform DMA-like memory transfers without suffering the overhead of multiple instruction fetches and executions for each memory address tested. Newer microprocessors such as the 80286 have block move and compare features, which permit moving and comparing large blocks of data from ranges of addresses. For example, the 80286 is capable of moving up to 64 kilobytes of data with a single block move instruction. Thus, rather than using a memory test program instruction that accesses data from a single address, data from a range of addresses may be accessed.

Referring to FIG. 3, a simple example of block movement is shown. A source pointer indicates the first address in a block which for this example has five addresses. Data is written into the five addresses. A destination pointer indicates the first address of a five-address block into which data is to be moved. While the very next address, i.e., "6" is indicated by the destination pointer, in actuality any desired address could be indicated, Upon command, the data in address "1" through "5" are moved to addresses "6" through "10" respectively, as shown by the arrows in FIG. 3. Thus, particularly for microprocessor-based boards or units having large memories, exploitation of block move and compare operations provide for another order of magnitude speed increase of memory tests.

A memory test algorithm which takes advantage of the block move and compare operations in accordance with one aspect of the present invention is represented schematically in FIG. 4. The algorithm comprises four sweeps or passes of the RAM addresses, performing three write operations ("writes") and either two or five read operations ("reads") at each location, depending on the particular implementation, employing block move and compare operations. Hence, each cell is accessed five times for a 5N algorithm, or eight times for an 8N algorithm.

First, a block of pseudorandom data is written to the low-address end of the UUT RAM being tested. This becomes the reference block shown in FIG. 4 as a short segment near the start address for each upward sweep through the address range. The length of the reference block may depend upon the memory size and the block move capabilities of a given microprocessor; however, a length chosen to be relatively prime with respect to mathematical powers of two will prevent common aliasing problems due to address decoding faults from being inadvertently missed.

Next, software or pointers, such as the source and destination pointers associated with the 80286, are set up such that data may be read from the first address of the UUT RAM and written to the first location following the reference block. For example, if the reference block of addresses is 0 through 99, the source pointer will be pointing to the 0 address and the destination pointer will be pointing to the 100 address and the data read from the 0 address will be moved and written into the 100 address. A string move operation is initiated which causes the reference block to be replicated over and over (iteratively) until the last address has been reached. This can be accomplished for the 5N algorithm using the source pointer to repetitively read the reference block while the destination pointer sweeps up through the address range of the memory, copying data from the location of the source or lower pointer to that of the destination or upper pointer, or for the 8N algorithm, both pointers may be swept up through the memory in tandem, maintaining the one block-length offset as they progress upward until the last address is written. This completes the first pass through the memory.

For the second pass of the memory, the original block of pseudorandom data is complemented bit for bit, and then written to the low-address end of the UUT RAM being tested thereby to become the reference block. Again the pointers are set up to the first address of the UUT RAM and the first location following the bit-wise complemented pseudorandom data so that data can be read from the address designated by the source pointer and written to the address designated by the destination pointer. And as before for the first pass of the memory, a string move operation is performed, this time filling the UUT RAM with a series of complemented blocks of data. At this point, every data cell has made at least one transition in value, e.g., from zero to one or one to zero.

Next, a downward sweep from the highest address to the lowest address is performed. At each location, data is read, compared with its expected value, complemented, and written back. If any location returns a value which does not match the expected data, the test halts and the erroneous results are noted. By the time the lowest address is processed, all data cells have transitioned through both logic states.

For the fourth and final pass through the memory, data at the low-address end of the UUT RAM is read and compared with the original pseudorandom data. Next, the remaining memory locations are read and compared to their expected values. Again, this can be accomplished for the 5N algorithm using the source pointer to repetitively read the reference block while the destination pointer sweeps up through the address range of the memory reading and comparing the data, and, in the case of an 8N algorithm, an upward sweep through the memory is initiated with pointers set up to perform a string compare between locations which have already been validated and locations one block length higher in memory. Again, if any location does not return the expected data value, the test halts, and erroneous results are noted.

The above-described functional test algorithm may be written as a set of instructions to be stored in and executed from UUT 20's executable memory, or stored in and executed from overlaid memory located in interface pod 12 as described earlier. The block of pseudorandom data may be provided by a pseudorandom generator located either in interface pod 12 or in mainframe unit 10. Note that the pseudorandom data for the entire test need be calculated only once, and that the original data is re-used and manipulated where appropriate. The block of pseudorandom data maybe stored in the overlay RAM and copied to the reference block area at the low-address end of the UUT RAM. Also, obvious variations may alter the algorithm slightly from a true 5N or 8N Probabilistic Test, depending on memory size, the amount of data a given microprocessor is capable of moving with a single block move instruction, and the amount of available calculated pseudorandom data. For example, on the first pass of the memory, the data in the reference block may be written into a number of consecutive blocks to provide a segment, which in turn is used by the source and destination pointers to sweep upward through the memory in segments, or even groups of segments. In such a situation, some of the lower addresses may be read more than once, and consequently, these addresses undergo more than eight accesses.

Thus, it can be discerned that executing memory test instructions at the UUT's own clock rate, and the use of block move and compare features of newer microprocessors substantially increases the speed at which memories of microprocessor-based units can be tested even through a slightly larger number of accesses than the prior-art Jacobson algorithm are performed at each memory location. Also, because of the slightly larger number of accesses that are made, accuracy of fault detection is at least as good, and perhaps better, than that achieved by the Jacobson algorithm.

While I have shown and described the preferred embodiment of my invention, and by way of illustration set forth the test mode contemplated by me of carrying out my invention, it will occur to those skilled in the art that the invention is capable of other different embodiments, and its several details are capable of modifications in various obvious respects, all without departing from the invention in its broader aspects. For example, ROM test algorithms may be programmed into overlay or UUT memory for execution of ROM tests, or even used in systems based on memory emulation techniques. In the latter case, the algorithm is loaded into emulated execution memory of a UUT and is executed by the UUT's native processor under control of a test system.

Another alternative would be to employ a DMA (Direct Memory Access) emulator as the UUT interface rather than a processor emulator. Since DMA devices by definition are capable of block transfer operation, use of block-oriented memory test algorithms as described herein would provide the same level of speed improvements as offered by the hereindescribed preferred embodiments.

what I claim as being novel is:

1. A method of functionally testing a memory having a plurality of addressable cells, comprising the steps of:
   (a) writing a pseudorandom sequence of bits into a predetermined number of consecutively-addressed memory cells to provide a reference block;
   (b) replicating said reference block by iteratively reading said pseudorandom sequence of bits and writing said bits into next successive blocks in a first direction until all of the memory cells are written.
   (c) complementing the contents of said reference block;
   (d) again replicating said reference block by iteratively reading complemented bits of said pseudorandom sequence and writing said complemented bits into next successive blocks in said first direction until all of the memory cells are written;
   (e) sequentially reading each cell in a second direction opposite said first direction, complementing the data therein, and writing said complemented data back into said cell;
   (f) again reading each cell in said first direction and comparing said complemented data with said pseudorandom sequence of bits to detect differences, and, in response, (g) identifying any memory faults.

2. A method in accordance with claim 1 further comprising the step of comparing data read from each cell in step (e) with an expected value to detect differences, and, in response, identifying any memory faults.

3. A method in accordance with claim 1 wherein the number of memory cells in said reference block is relatively prime with respect to mathematical powers of two.

4. A method in accordance with claim 1 wherein the replicating in steps (b) and (d) is accomplished in conjunction with a first pointer to indicate the cell being read and a second pointer indicating a cell being written.

5. A method in accordance with claim 4 wherein said first and second pointers are controlled by block move instructions from an associated processor.

6. A method in accordance with claim 1 wherein said first direction is from a low address to a high address, and said second direction is from said high address to said low address.

7. A method in accordance with claim 1 wherein said steps of writing and reading bits into and from said cells are performed at a rate determined by a clock system of the memory being tested.

8. A method as recited in claim 1 wherein said reference block includes a plurality of address.

9. A method of functionally testing a memory under test coupled to a bus structure in a microprocessor-based unit which also includes a clock circuit for providing timing signals therein, comprising the steps of:

coupling a test system to said bus structure, said test system including a test system microprocessor and a test system memory containing a set of test instructions;

coupling said timing signals from said clock circuit to said test system microprocessor;

electrically transferring said set of test instructions to a predetermined portion of said memory under test; and executing said test instructions under control of said test system microprocessor in response to said timing signals, wherein said test system remains effectively permanently coupled to said bus structure while executing said test instructions.

10. A method in accordance with claim 9 wherein said step of electrically transferring said set of instructions is carried out by a memory overlay technique.

11. A method in accordance with claim 9 wherein said test system microprocessor employs block move instructions in executing said test instructions.

12. A method in accordance with claim 9 wherein said test instructions include writing a pseudorandom sequence of bits to a fractional segment of said memory under test to provide a reference block of memory cells, and then replicating said reference block throughout a remaining portion of said memory under test.

13. A method of functionally testing a memory having a plurality of addressable cells over a range from a low address to a high address, comprising the steps of:

(a) writing a pseudorandom sequence of bits into said plurality of addressable cells by first writing said pseudorandom sequence of bits into a reference block of a plurality of cells starting with the low address and replicating said reference block over said range to the high address;

(b) complementing all of the bits in said plurality of addressable cells by first complementing the bits in said reference block and replicating said reference block over said range to the high address;

(c) sequentially reading each cell over the range from the high address to the low address, and complementing the bit in each cell a second time to restore a logic state first written in step (a); and (d) sequentially reading each cell over the range from the low address to the high address, and comparing the second-complemented bit in each cell with said pseudorandom sequence of bits to detect any difference therebetween.

14. A method in accordance with claim 13 further comprising the step of indicating any memory faults in response to any detected differences.

15. A method in accordance with claim 13 further comprising the step of comparing the bit read from each cell in step (c) with an expected value to detect differences, and, in response, identifying any memory faults.

16. A method in accordance with claim 13 wherein said replicating in steps (a) and (b) is controlled by a microprocessor having block move capabilities.

17. A system for functionally testing a memory under test in which the memory under test is coupled to a bus structure in a microprocessor-based unit which also has a clock providing timing signals at a predetermined rate, comprising:

a test system microprocessor coupled to said bus structure for communication with said memory under test;

a test system memory associated with said test system microprocessor and coupled thereto, said test system memory containing a set of test instructions;

means for electrically transferring said set of test instructions to a portion of said memory under test; and means for coupling said timing signals to said test system microprocessor to cause said set of test instructions to be executed at said predetermined rate, wherein said test system microprocessor remains in direct communication with said memory under test while said set of test instructions are executed.

18. A system in accordance with claim 17 wherein said test system microprocessor is the same type as that of the microprocessor-based unit.

19. A system in accordance with claim 17 wherein said means for electrically transferring said set of test instructions to a portion of said memory under test includes means for overlaying a portion of said memory under test with a portion of said test system memory.

20. A system in accordance with claim 17 wherein said microprocessor employs block move and compare capabilities in testing said memory under test.

21. A system in accordance with claim 17 wherein said set of test instructions includes an algorithm which writes a pseudorandom sequence of bits into a reference block of addressable cells of said memory under test and replicates said reference block iteratively into remaining addressable cells to establish a basis for testing for memory faults.

22. A test system for functionally testing a memory under test having a plurality of addressable cells over a range from a low address to a high address, comprising:

means for writing a pseudorandom sequence of bits into said plurality of addressable cells by first writing said pseudorandom sequence of bits into a reference block of cells starting with the low address and iteratively replicating said reference block over said range to the high address;

means for complementing all of the bits in said plurality of addressable cells by first complementing the bits in said reference block and iteratively replicating said reference block over said range to the high address;

means for sequentially reading each cell over the range from the high address to the low address, and complementing the bit in each cell a second time;

means for sequentially reading each cell over the range from the low address to the high address and comparing the second-complemented bit in each cell with said pseudorandom sequence of bits to detect any differences therebetween; and means responsive to said differences for indicating memory faults.

23. A test system as recited in claim 22 further comprising an associated microprocessor having block move capabilities for performing the functions of iteratively replicating the reference block.

24. A method of functionally testing a memory having a plurality of addressable cells, comprising the steps of:

(a) writing a pseudorandom sequence of bits into a predetermined number of consecutively-addressed memory cells to provide a reference block;

(b) replicating said reference block of iteratively reading said pseudorandom sequence of bits and writing said bits into next successive blocks in a first direction until all of the memory cells are written;

(c) complementing the contents of said reference block;

(d) again replicating said reference block by iteratively reading complemented bits of said reference block and writing said complemented bits into next successive blocks in said first direction until all of the memory cells are written;

(e) sequentially reading each cell in a second direction opposite said first direction, complementing the data therein, and writing said complemented data back into said cell;

(f) again reading each cell in said first direction and comparing said complemented data with said pseudorandom sequence of bits to detect differences, and, in response, (g) identifying any memory faults.

* * * * *